(12) United States Patent
Lin et al.

(10) Patent No.: US 11,985,765 B2
(45) Date of Patent: May 14, 2024

(54) POWER ADAPTER

(71) Applicant: FSP TECHNOLOGY INC., Taoyuan (TW)

(72) Inventors: Che-Min Lin, Taoyuan (TW); Chia-Hua Liu, Taoyuan (TW); Ching-Kai Lin, Taoyuan (TW)

(73) Assignee: FSP TECHNOLOGY INC., Taoyuan (TW)

( * ) Notice: Subject to any disclaimer, the term of this patent is extended or adjusted under 35 U.S.C. 154(b) by 171 days.

(21) Appl. No.: 17/876,570

(22) Filed: Jul. 29, 2022

(65) Prior Publication Data
US 2023/0108785 A1    Apr. 6, 2023

(30) Foreign Application Priority Data
Oct. 6, 2021    (TW) .................................. 110137181

(51) Int. Cl.
*H05K 1/18* (2006.01)
*H01F 27/28* (2006.01)
*H01F 27/32* (2006.01)

(52) U.S. Cl.
CPC ........... *H05K 1/18* (2013.01); *H01F 27/2828* (2013.01); *H01F 27/32* (2013.01);
(Continued)

(58) Field of Classification Search
CPC .. H05K 1/18; H05K 1/181–187; H01R 13/66; H01R 13/665; H01F 27/28; H01F 27/29; H01F 27/32; H01F 27/2828
(Continued)

(56) References Cited

U.S. PATENT DOCUMENTS 5,973,923 A * 10/1999 Jitaru .................... H01F 27/06
361/740
6,549,409 B1 * 4/2003 Saxelby, Jr. ......... H05K 1/0203
174/548
(Continued)

FOREIGN PATENT DOCUMENTS

CN     208673883     3/2019
CN     211266541     8/2020

*Primary Examiner* — Tuan T Dinh
(74) *Attorney, Agent, or Firm* — JCIPRNET

(57) ABSTRACT

A power adapter includes a circuit board, an electromagnetic interference filter, a shielding element, a power factor correction (PFC) inductor, a transformer and heating elements. The circuit board has a front side and a back side corresponding to each other, and a first long side and a second long side parallel to each other. The front side of the circuit board is divided into a first region, a second region and a third region along an extending direction of the first long side. The electromagnetic interference filter is disposed in the first region and close to the first long side. The shielding element is disposed in the first region and close to the electromagnetic interference filter. The PFC inductor is disposed in the first region of the circuit board and close to the second long side. The PFC inductor has a first long axis. The transformer is disposed in the third region and close to the first long side. The transformer has a second long axis, and the first long axis is perpendicular to the second long axis. The heating elements are disposed at the back side of the circuit board.

10 Claims, 5 Drawing Sheets

(52) U.S. Cl.
CPC .............. *H05K 2201/10015* (2013.01); *H05K 2201/1003* (2013.01); *H05K 2201/1006* (2013.01); *H05K 2201/10166* (2013.01); *H05K 2201/10189* (2013.01); *H05K 2201/10522* (2013.01); *H05K 2201/10545* (2013.01)

(58) Field of Classification Search
USPC ................ 361/782–784, 800, 803, 816, 818; 257/660–690
See application file for complete search history.

(56) References Cited

U.S. PATENT DOCUMENTS

| | | | | |
|---|---|---|---|---|
| 7,254,042 | B2 * | 8/2007 | Huang ................. | H05K 9/0022 361/753 |
| 10,321,569 | B1 * | 6/2019 | Butler .................... | H05K 1/115 |
| 2009/0251851 | A1 * | 10/2009 | McGill, Sr. ............ | H05K 7/186 361/676 |
| 2012/0051012 | A1 * | 3/2012 | Joo ...................... | H05K 9/0054 361/753 |
| 2016/0128236 | A1 * | 5/2016 | Pietrantonio ...... | H05K 7/20509 361/702 |

* cited by examiner

POWER ADAPTER

CROSS-REFERENCE TO RELATED APPLICATION

This application claims the priority benefit of Taiwan application serial no. 110137181, filed on Oct. 6, 2021. The entirety of the above-mentioned patent application is hereby incorporated by reference herein and made a part of this specification.

BACKGROUND

Technology Field

The disclosure relates to a power supply, and particularly, to a power adapter.

Description of Related Art

Power adapters are widely applied in portable electronic products, such as notebook computers or game consoles. The power of a power adapter is subject to the electrical parameters and the dimensions of electronic elements, such as power factor correction transistors, bridge rectifiers, power factor correction inductors, capacitors, and transformers configured inside the power adapter.

With the advancement and development of technology, consumers have an increasing demand for electronic products, such as notebook computers or game consoles, with characteristics of being lightweight, thin, and compact. Therefore, how to reduce the overall volume of a power adapter without affecting the power of the power adapter so as to implement electronic products with the characteristics of being lightweight, thin, and compact and to meet the demand of the consumers is one of future research directions.

SUMMARY

The disclosure provides a power adapter capable of effectively improving the space utilization rate and the power density of a circuit board.

The power adapter of the disclosure includes a circuit board, an electromagnetic interference filter, a shielding element, a power factor correction (PFC) inductor, a transformer, and multiple heating elements. The circuit board has a front side and a back side opposite to each other, and a first long side and a second long side parallel to each other. The front side of the circuit board is sequentially divided into a first region, a second region, and a third region in an extending direction of the first long side. The electromagnetic interference filter is disposed in the first region and close to the first long side on the circuit board. The shielding element is disposed in the first region and close to the electromagnetic interference filter on the circuit board. The power factor correction (PFC) inductor is disposed in the first region and close to the second long side on the circuit board. The power factor correction inductor has a first long axis. The transformer is disposed in the third region and close to the first long side on the circuit board. The transformer has a second long axis, and the first long axis of the power factor correction inductor is perpendicular to the second long axis of the transformer. The heating elements are disposed on the back side of the circuit board.

In an embodiment of the disclosure, the power adapter further includes a first capacitor disposed at a position across the second region and the third region and close to the second long side on the circuit board.

In an embodiment of the disclosure, in the power adapter, the first capacitor has a third long axis, and the third long axis of the first capacitor is perpendicular to the second long axis of the transformer.

In an embodiment of the disclosure, the power adapter further includes a second capacitor, a half-bridge resonant capacitor, and a half-bridge resonant inductor, disposed in the second region and between the electromagnetic interference filter and the transformer on the circuit board.

In an embodiment of the disclosure, in the power adapter, the second capacitor is close to the first long side, the half-bridge resonant capacitor is farther from the first long side compared with the second capacitor, and the half-bridge resonant inductor is disposed between the second capacitor and the half-bridge resonant capacitor.

In an embodiment of the disclosure, in the power adapter, the half-bridge resonant capacitor includes a fourth long axis, the half-bridge resonant inductor includes a fifth long axis, and the fourth long axis is perpendicular to the fifth long axis.

In an embodiment of the disclosure, in the power adapter, the fifth long axis is parallel to the second long axis.

In an embodiment of the disclosure, in the power adapter, the heating elements include a bridge rectifier switch, a power factor correction transistor, and/or a half-bridge resonant transistor, and the bridge rectifier switch is disposed at a position on the back side corresponding to the first region.

In an embodiment of the disclosure, the power adapter further includes an input plug. The circuit board has a first short side and a second short side parallel to each other, the input plug is disposed in the first region and close to the first long side and the first short side on the circuit board, and the shielding element is L-shaped and disposed between the electromagnetic interference filter and the power factor correction inductor and also between the electromagnetic interference filter and the transformer.

In an embodiment of the disclosure, the transformer further includes a wire frame, a coil, a magnetic core, and an insulating cover. The wire frame has a first end and a second end, a first pin portion is disposed at the first end, and a winding hook portion is disposed at the second end. The coil is wound around the wire frame, the coil has an input end and an output end, the input end is electrically connected to the first pin portion, and the output end is in contact with the winding hook portion. The magnetic core is in combination with the wire frame and the coil. The insulating cover is sleeved outside the wire frame and the magnetic core. A second pin portion corresponding to the first pin portion is disposed on the insulating cover. The output end of the coil is in contact with the winding hook portion, passes over the insulating cover, and is then connected to the second pin portion.

In summary, in the power adapter of the disclosure, the electromagnetic interference filter and the power factor correction inductor are disposed in the first region, and the shielding element is disposed in the first region and close to the electromagnetic interference filter on the circuit board. The transformer is disposed in the third region close to the first long side on the circuit board, and the first long axis of the power factor correction inductor and the second long axis of the transformer are perpendicular to each other. The heating elements are disposed at the back side of the circuit board. With such design, the overall volume of the power adapter of the disclosure can be reduced without affecting the power, and the space utilization rate of the circuit board can be improved to attain the characteristics of electronic products being lightweight, thin, and compact to meet the consumer demand.

DESCRIPTION OF THE EMBODIMENTS

Figure 1:
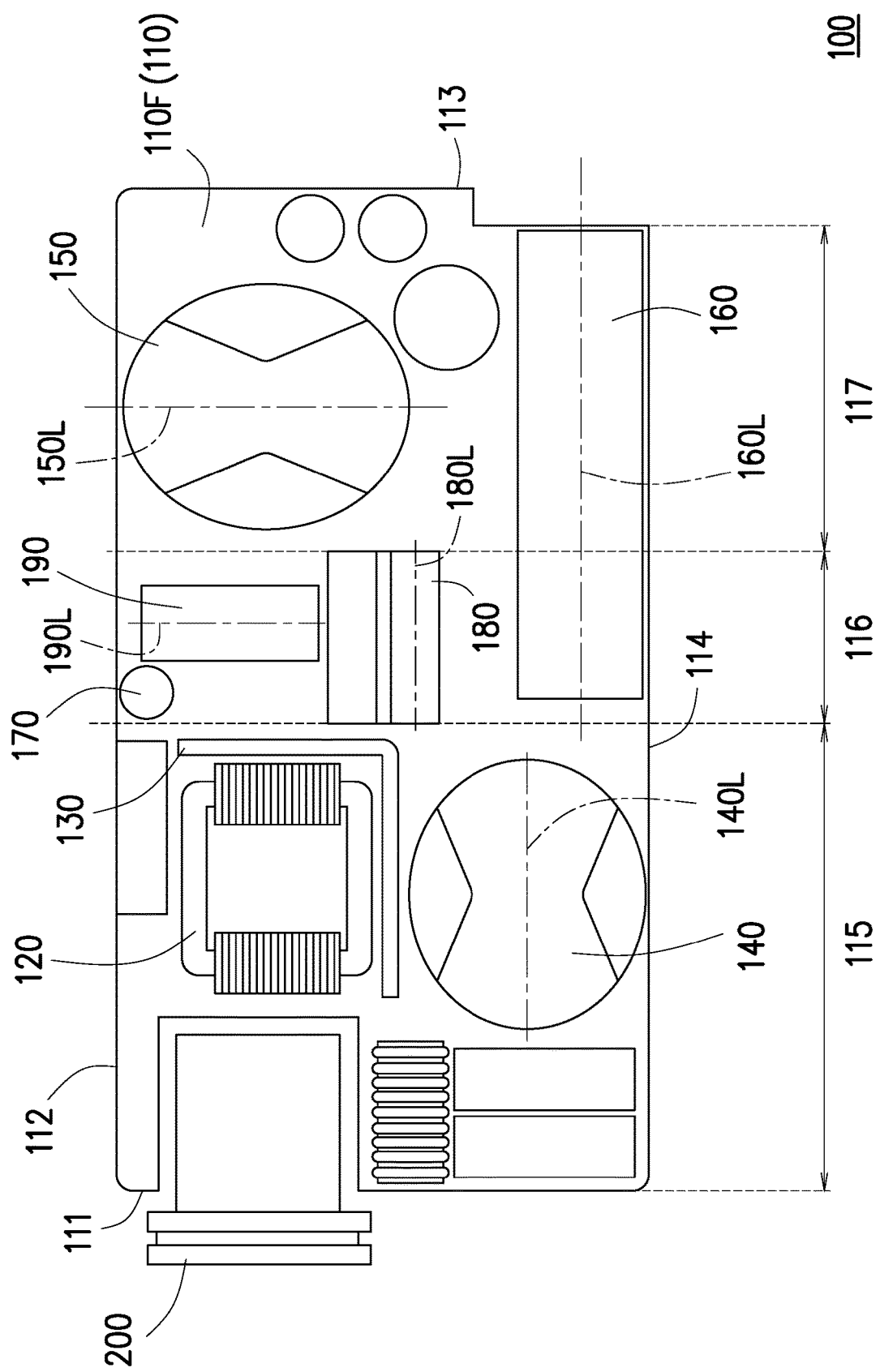
FIG. 1 is a schematic view of the front side of a power adapter according to an embodiment of the disclosure.
Figure 2:
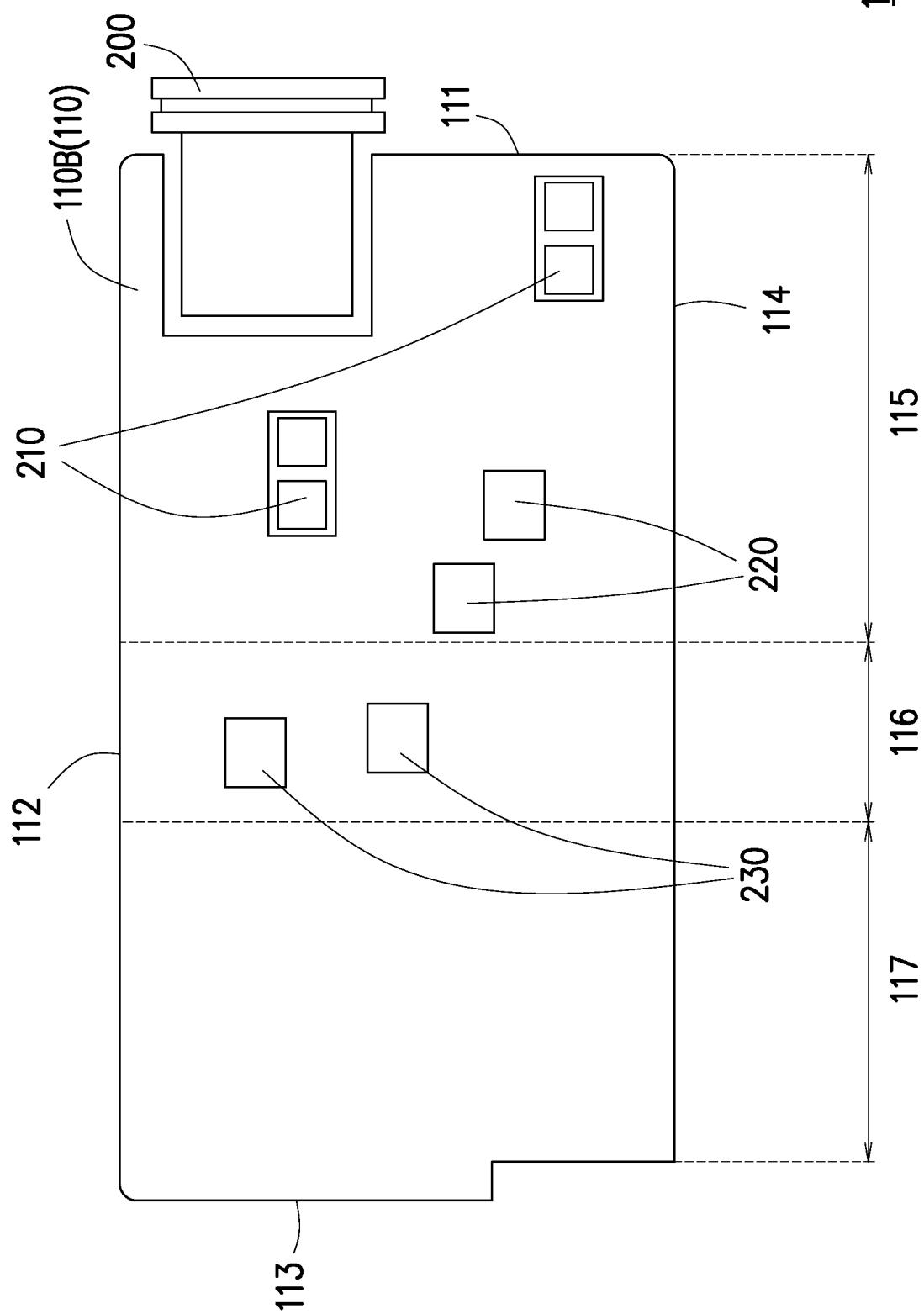
FIG. 2 is a schematic view of the back side of the power adapter in FIG. 1.

FIG. 1 is a schematic view of the front side of a power adapter according to an embodiment of the disclosure. Referring to FIG. 1, in the embodiment, a power adapter 100 includes a circuit board 110, and the circuit board 110 has a front side 110F and a back side 110B opposite to each other (as shown in FIG. 2).

In addition, the circuit board 110 further has a first long side 112 and a second long side 114 parallel to each other, and a first short side 111 and a second short side 113 parallel to each other. As shown in FIG. 1, the circuit board 110 can be sequentially divided into a first region 115, a second region 116, and a third region 117 along the direction of the first long side 112 and the second long side 114. In the embodiment, the first region 115 is larger than the third region 117, and the third region 117 is larger than the second region 116.

The power adapter 100 further includes an electromagnetic interference filter 120, a shielding element 130, a power factor correction inductor 140, a transformer 150, a first capacitor 160, a second capacitor 170, a half-bridge resonant capacitor 180, and a half-bridge resonant inductor 190 configured on the front side 110F of the circuit board 110.

In the embodiment, the electromagnetic interference filter 120 is disposed at a position of the first region 115 close to the first long side 112 on the circuit board 110. The power factor correction inductor 140 is disposed at the position of the first region 115 close to the second long side 114 on the circuit board 110. The power factor correction inductor 140 has a first long axis 140L. The first long axis 140L of the power factor correction inductor 140 is parallel to the second long side 114, so that the space occupied by the power factor correction inductor 140 in the short side direction of the circuit board 110 can be reduced.

The transformer 150 is disposed at a position of the third region 117 close to the first long side 112 on the circuit board 110. The transformer 150 has a second long axis 150L. The second long axis 150L of the transformer 150 is perpendicular to the first long axis 140L of the power factor correction inductor 140, so that the space occupied by the transformer 150 in the long side direction of the circuit board 110 can be reduced.

That is, in the power adapter 100, the large-sized power factor correction inductor 140 and the transformer 150 are configured on the front side 110F of the circuit board 110 in a manner by which the second long axis 150L is perpendicular to the first long axis 140L, and the available space of the circuit board 110 in the long side direction or in the short side direction can be increased.

Furthermore, in the embodiment, the shielding element 130 is disposed at a position of the first region 115 close to the electromagnetic interference filter 120 and between the electromagnetic interference filter 120 and the power factor correction inductor 140. The shielding element 130 is also disposed at a position between the electromagnetic interference filter 120 and the half-bridge resonant inductor 190 to block the noise from the power factor correction inductor 140, the transformer 150, and the half-bridge resonant inductor 190. The shielding element 130 is L-shaped, for example; but in other embodiments, the shielding element 130 may also be annular or in other shapes.

By first designing how to configure the larger-sized elements on the circuit board 110 and next designing how to configure the smaller-sized first capacitor 160, second capacitor 170, half-bridge resonant capacitor 180, and half-bridge resonant inductor 190 on the circuit board 110, the layout of the elements of the power adapter 100 can be determined, so that the configuration density of elements on the circuit board 110 can be increased.

In the embodiment, the first capacitor 160 is disposed at a position across the second region 116 and the third region 117 close to the second long side 114 on the circuit board 110. In addition, the first capacitor 160 has a third long axis 160L, and the third long axis 160L is perpendicular to the second long axis 150L of the transformer 150.

In the embodiment, the design in which the third long axis 160L is perpendicular to the second long axis 150L may allow the transformer 150 to be partially overlapped with the first capacitor 160 in the long side direction of the circuit board 110, thereby increasing the configuration density.

In other embodiments, the third long axis 160L of the first capacitor 160 may also be parallel to the second long axis 150L of the transformer 150, and the third long axis 160L is parallel to the first short side 111. Such a design allows the transformer 150 to be partially overlapped with the first capacitor 160 in the short side direction of the circuit board 110, thereby increasing the configuration density.

In addition, the second capacitor 170 is disposed at a position of the second region 116 close to the first long side 112 on the circuit board 110. The half-bridge resonant capacitor 180 is disposed at a position of the second region 116 farther from the first long side 112 compared with the position of the second capacitor 170 on the circuit board 110. The half-bridge resonant inductor 190 is disposed at a position of the second region 116 between the second capacitor 170 and the half-bridge resonant capacitor 180 on the circuit board 110.

In the embodiment, the half-bridge resonant capacitor 180 and the half-bridge resonant inductor 190 have a fourth long axis 180L and a fifth long axis 190L, respectively. The fourth long axis 180L of the half-bridge resonant capacitor 180 is parallel to the third long axis 160L of the first capacitor 160. The fifth long axis 190L of the half-bridge resonant inductor 190 is perpendicular to the fourth long axis 180L of the half-bridge resonant capacitor 180 and parallel to the second long axis 150L of the transformer 150.

According to FIG. 1, the half-bridge resonant capacitor 180 is disposed between the shielding element 130 and the transformer 150, and the length of the half-bridge resonant capacitor 180 is only slightly less than the distance between the shielding element 130 and the transformer 150. That is, the length of the half-bridge resonant capacitor 180 is quite equal to the length of the second region 116 in the long side direction.

In the embodiment, the design in which the fourth long axis 180L of the half-bridge resonant capacitor 180 is parallel to the third long axis 160L of the first capacitor 160 allows the half-bridge resonant capacitor 180 to make full use of the length of the second region in the long side direction, and the space occupied by the half-bridge resonant capacitor 180 in the short side direction of the second region can be reduced. Accordingly, the space of the second region in the short side direction can be released for configuring the half-bridge resonant inductor 190 with a longer length.

In addition, in the embodiment, the circuit board 110 has an input plug 200 disposed in the first region 115 close to the first long side 112 and the first short side 111 on the circuit board 110.

FIG. 2 is a schematic view of the back side of the power adapter in FIG. 1. Referring to FIG. 2, in the embodiment, the power adapter 100 includes multiple heating elements disposed on the back side 110B of the circuit board 110. The heating elements at least include a bridge rectifier switch 210, a power factor correction transistor 220, and/or a half-bridge resonant transistor 230. According to FIG. 2, the bridge rectifier switch 210 and the power factor correction transistor 220 are disposed on the back side corresponding to the first region 115, and the half-bridge resonant transistor 230 is disposed on the back side corresponding to the second region 116.

In addition, the heating element adopts, for example, a metal-oxide-semiconductor (MOS) as a raw material, which can be produced at a lower cost compared to gallium nitride (GaN). The type and material of the heating element are not limited thereto.

Note that, for example, the dimensions of the power adapter 100 in the embodiment are about 113.5 mm in length, 64.5 mm in width, and 23 mm in thickness. The dimensions of a conventional power adapter are approximately 140.1 mm in length, 65.1 mm in width, and 25.4 mm in thickness. Therefore, the volume of the power adapter 100 of the embodiment is reduced by about 27.3%. Moreover, if it is assumed that the power of the power adapter 100 of the embodiment and the power of the conventional power adapter are both 180 W, then the power density of the power adapter 100 of the embodiment is about 1.069 (W/cm$^3$), and the power density of the conventional power adapter is 0.777 (W/cm$^3$). In short, the power density of the power adapter 100 of the embodiment is improved by about 37.58% compared with the power density of the conventional power adapter.

In addition, note that in other embodiments, the detailed dimensions of the power adapter 100 in the embodiment may be slightly different, the power and the power density of the power adapter 100 are only illustrated as examples, and the disclosure does not limit the detailed dimensions, the power, and the power density of the power adapter 100.

Figure 3:
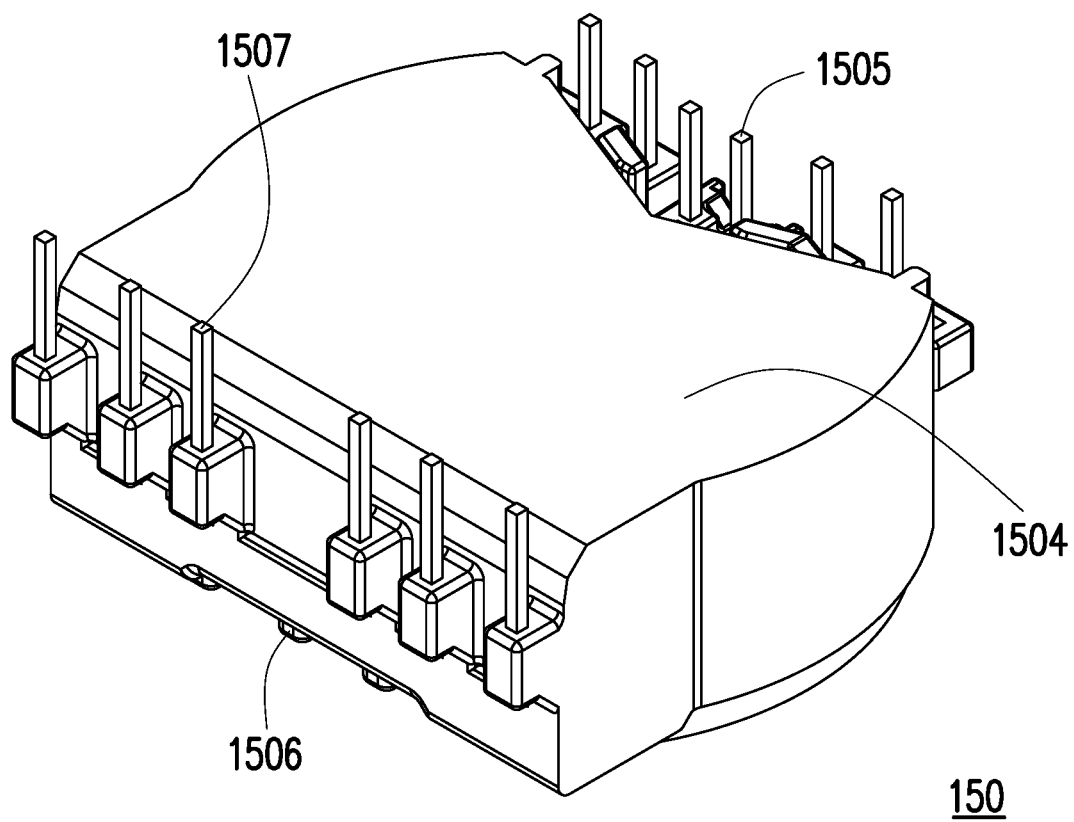
FIG. 3 is a schematic view of a transformer of the power adapter in FIG. 1.
Figure 4:
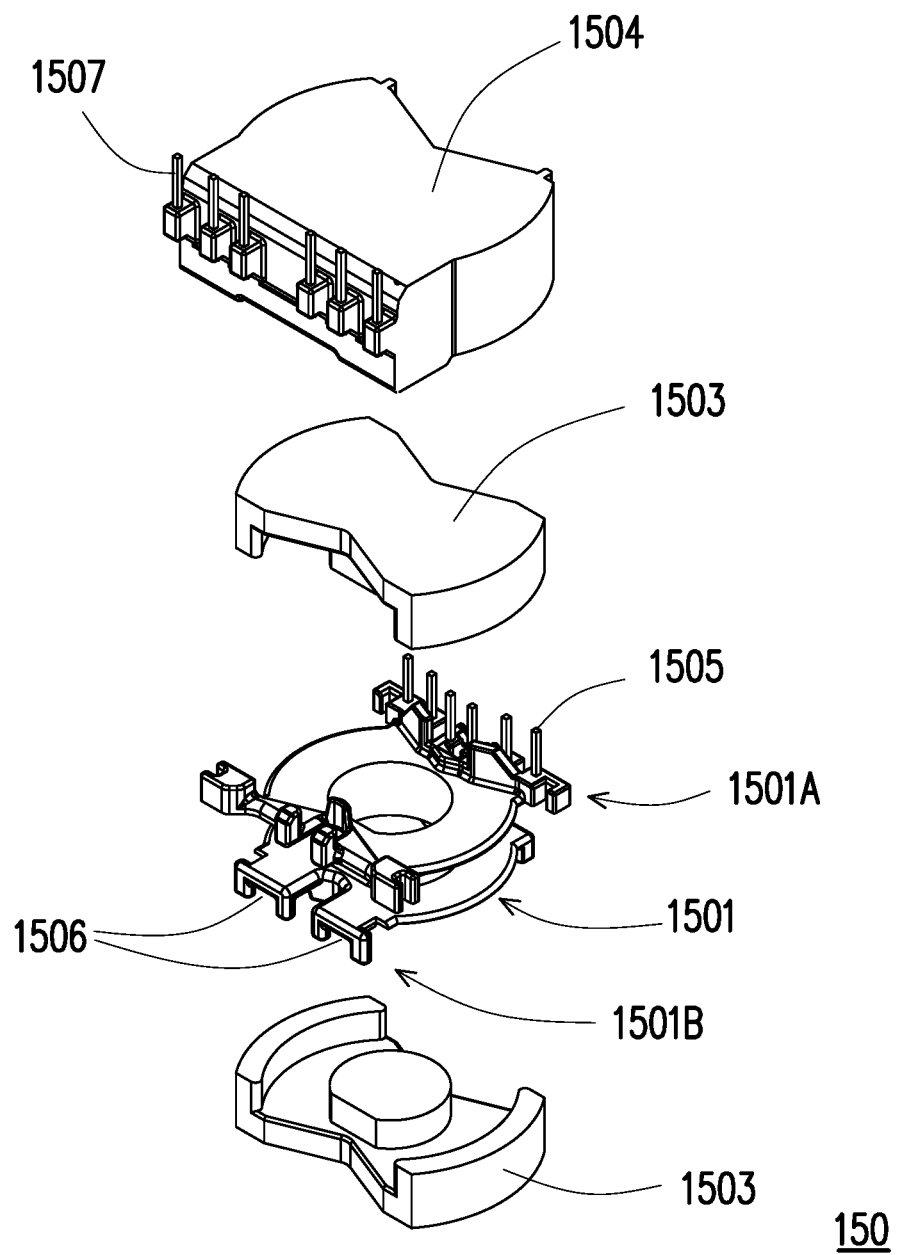
FIG. 4 is an exploded view of the transformer in FIG. 3.
Figure 5:
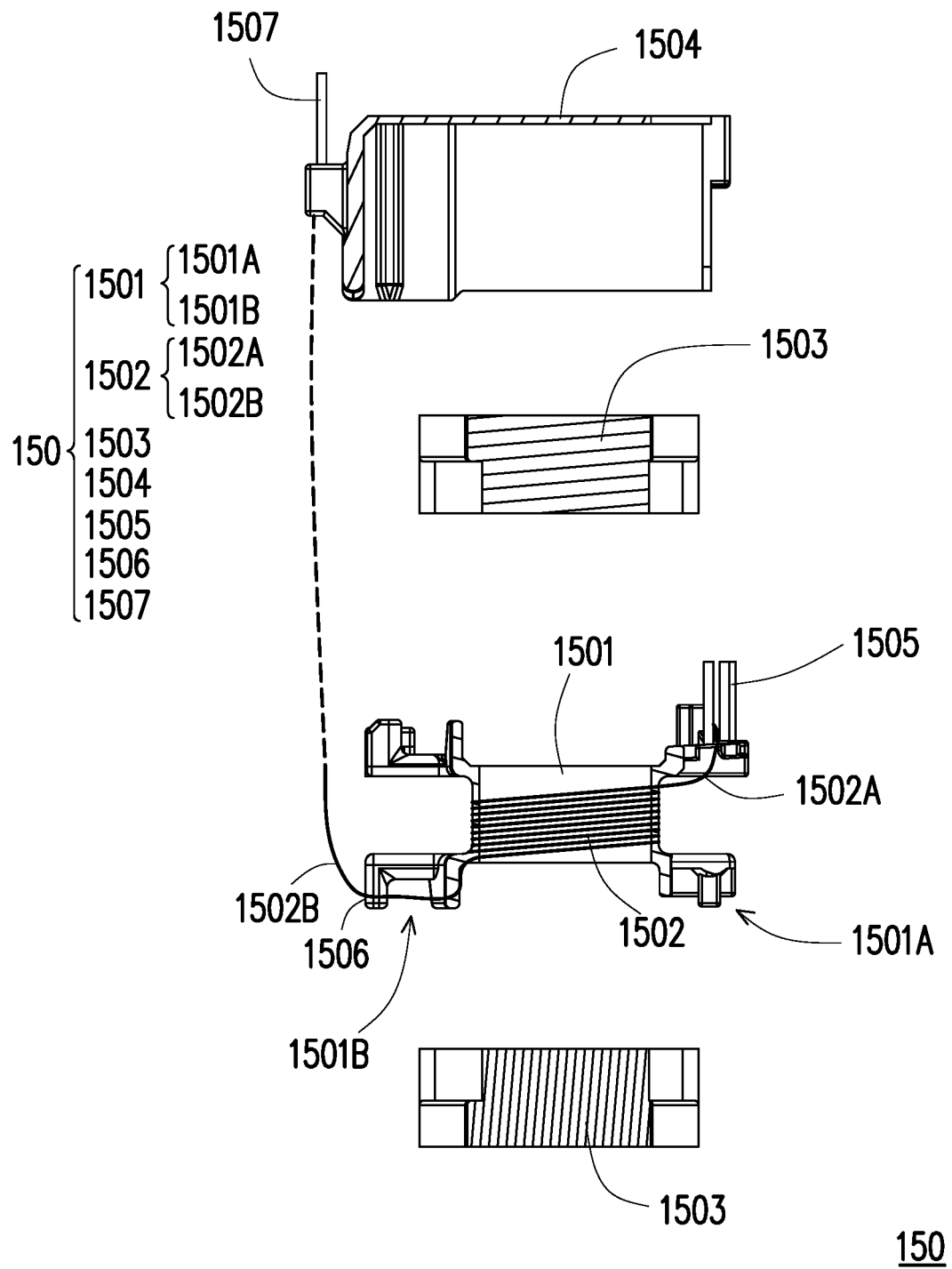
FIG. 5 is a cross-sectional view of the transformer in FIG. 3.

In addition to improving the configuration of the power adapter, the disclosure also improves the transformer. To meet the requirement of the insulation distance of safety regulations, the conventional method of manually bundling insulating tapes makes it difficult to process the power adapter, which fails to contribute to mass production and cannot be improved to an automated process. Referring to FIG. 3 to FIG. 5 in the subsequent paragraphs, FIG. 3 is a schematic view of the transformer of the power adapter in FIG. 1, FIG. 4 is an exploded view of the transformer in FIG. 3, and FIG. 5 is a cross-sectional view of the transformer in FIG. 3. Note that coils are not shown in FIG. 3 and FIG. 4 but shown in FIG. 5.

Referring to FIG. 3 to FIG. 5 altogether, the transformer 150 includes a wire frame 1501, a coil 1502 (as shown in FIG. 5), two magnetic cores 1503 (as shown in FIG. 4), and an insulating cover 1504. As shown in FIG. 4, the two magnetic cores 1503 are disposed in a central hole of the wire frame 1501 by passing therethrough. As shown in FIG. 3, the magnetic core 1503 (as shown in FIG. 4) along with the wire frame 1501 and the coil 1502 (as shown in FIG. 5) are sheathed by the insulating cover 1504.

The wire frame 1501 has a first end 1501A and a second end 1501B. A first pin portion 1505 is disposed at the first end 1501A, and a winding hook portion 1506 is disposed at the second end 1501B. A second pin portion 1507 is disposed on the insulating cover 1504.

As shown in FIG. 5, the coil 1502 is wound around the wire frame 1501, and the coil 1502 has an input end 1502A and an output end 1502B. The input end 1502A of the coil 1502 is connected to the first pin portion 1505 of the wire frame 1501. The output end 1502B of the coil 1502 is wound around the winding hook portion 1506, passes over the insulating cover 1504, and then is connected to the second pin portion 1507 of the insulating cover 1504.

The winding hook portion 1506 allows the output end 1502B to effectively widen the distance between the output end 1502B and the coil 1502 inside the insulating cover 1504, by which not only is the requirement of the insulation distance of safety regulations met, but also the probability of the mutual contact between the output end 1502B and the coil 1502 is reduced. In addition, the insulating cover 1504 of the transformer 150 can keep the output end 1502B outside the insulating cover 1504, and thereby the mutual contact between the output end 1502B and the coil 1502 is prevented. On the other hand, a second pin portion 1507 conforming to different parameters according to actual requirements can be disposed on the insulating cover 1504, and the design margin and flexibility are large.

In summary, in the element layout of the power adapter of the disclosure, the positions and directions of four elements, the electromagnetic interference filter, the shielding element, the power factor correction inductor, and the transformer on the front side of the circuit board, are designed first. Next, the positions and directions of smaller-sized electronic elements, such as the first capacitor, the second capacitor, the half-bridge resonant capacitor, and the half-bridge resonant inductor, are arranged. Furthermore, the heating elements including the bridge rectifier switch, the power factor correction transistor, and/or the half-bridge resonant transistor are disposed on the back side of the circuit board. Accordingly, without affecting the power, the overall volume of the power adapter can be reduced, the space utilization and power density of the circuit board can be improved, and thereby the characteristics of electronic products being lightweight, thin, and compact can be attained to meet the consumer demand.

In addition, the transformer of the power adapter of the disclosure is designed with an insulating cover and a winding hook portion, so that the output end of the coil is in contact with the winding hook portion and then connected to the second pin after passing over the insulating cover. This processing method is not only easy but can effectively increase the safety distance between the output end of the second pin and the coil, and meanwhile the mutual contact between the output end and the coil can be further prevented, thereby improving safety.

What is claimed is:
1. A power adapter comprising:
    a circuit board, comprising a front side and a back side opposite to each other, and a first long side and a second long side parallel to each other, wherein the front side of the circuit board is sequentially divided into a first region, a second region, and a third region in an extending direction of the first long side;

an electromagnetic interference filter, disposed in the first region and close to the first long side on the circuit board;

a shielding element, disposed in the first region and close to the electromagnetic interference filter on the circuit board;

a power factor correction (PFC) inductor, disposed in the first region and close to the second long side on the circuit board, wherein the power factor correction inductor comprises a first long axis;

a transformer, disposed in the third region and close to the first long side on the circuit board, wherein the transformer comprises a second long axis, wherein the first long axis of the power factor correction inductor is perpendicular to the second long axis of the transformer; and a plurality of heating elements, disposed on the back side of the circuit board.

2. The power adapter according to claim 1, further comprising a first capacitor disposed at a position across the second region and the third region and close to the second long side on the circuit board.

3. The power adapter according to claim 2, wherein the first capacitor comprises a third long axis, and the third long axis of the first capacitor is perpendicular to the second long axis of the transformer.

4. The power adapter according to claim 1, further comprising a second capacitor, a half-bridge resonant capacitor, and a half-bridge resonant inductor, disposed in the second region and between the electromagnetic interference filter and the transformer on the circuit board.

5. The power adapter according to claim 4, wherein the second capacitor is close to the first long side, the half-bridge resonant capacitor is farther from the first long side compared with the second capacitor, and the half-bridge resonant inductor is disposed between the second capacitor and the half-bridge resonant capacitor.

6. The power adapter according to claim 4, wherein the half-bridge resonant capacitor comprises a fourth long axis, the half-bridge resonant inductor comprises a fifth long axis, and the fourth long axis is perpendicular to the fifth long axis.

7. The power adapter according to claim 6, wherein the fifth long axis is parallel to the second long axis.

8. The power adapter according to claim 1, wherein the plurality of the heating elements comprise a bridge rectifier switch, a power factor correction transistor, and/or a half-bridge resonant transistor, wherein the bridge rectifier switch is disposed at a position on the back side corresponding to the first region.

9. The power adapter according to claim 1, further comprising an input plug, wherein the circuit board comprises a first short side and a second short side parallel to each other, the input plug is disposed in the first region and close to the first long side and the first short side on the circuit board, and the shielding element is L-shaped and disposed between the electromagnetic interference filter and the power factor correction inductor and also between the electromagnetic interference filter and the transformer.

10. The power adapter according to claim 1, wherein the transformer further comprises:
    a wire frame, comprising a first end and a second end, wherein a first pin portion is disposed at the first end, and a winding hook portion is disposed at the second end;
    a coil, wound around the wire frame, wherein the coil comprises an input end and an output end, the input end is electrically connected to the first pin portion, and the output end is in contact with the winding hook portion;
    a magnetic core, in combination with the wire frame and the coil; and
    an insulating cover, sleeved outside the wire frame and the magnetic core, wherein a second pin portion corresponding to the first pin portion is disposed on the insulating cover;
    wherein the output end of the coil is in contact with the winding hook portion, passes over the insulating cover, and is then connected to the second pin portion.

* * * * *